US006859414B2

United States Patent
Koo

(10) Patent No.: US 6,859,414 B2
(45) Date of Patent: Feb. 22, 2005

(54) DATA INPUT DEVICE IN SEMICONDUCTOR MEMORY DEVICE

(75) Inventor: Kie-Bong Koo, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 10/744,323

(22) Filed: Dec. 22, 2003

(65) Prior Publication Data

US 2004/0228203 A1 Nov. 18, 2004

(30) Foreign Application Priority Data

May 16, 2003 (KR) .................................. 10-2003-0031224

(51) Int. Cl.[7] .................................................. G11C 8/00
(52) U.S. Cl. .................... 365/233; 365/193; 365/189.05
(58) Field of Search ................................. 365/233, 193, 365/189.05

(56) References Cited

U.S. PATENT DOCUMENTS 6,741,521 B2 * 5/2004 Kono .................... 365/189.05
6,768,698 B2 * 7/2004 Kono .......................... 365/233

\* cited by examiner

Primary Examiner—Huan Hoang
(74) Attorney, Agent, or Firm—Blakely Sokoloff Taylor Zafman

(57) ABSTRACT

A data input device in a semiconductor device, includes a data strobe signal input buffer, which driven in response to a selection signal of a data input/output mode, for receiving a data strobe signal; a data input buffer driven in response to the selection signal; a repeater, which receives the selection signal and the data strobe signal input, outputs a first control signal of a first logic level when the selection signal is activated, and a second control signal of a second logic level when the selection signal is inactivated; and a latch for latching data provided from the data input buffer in response to the first control signal outputted from the repeater, wherein the latch is disabled when the second control signal is provided from the repeater.

9 Claims, 6 Drawing Sheets

DATA INPUT DEVICE IN SEMICONDUCTOR MEMORY DEVICE

FIELD OF THE INVENTION

The present invention relates to a semiconductor memory device; and, more particularly, to a data input device in a semiconductor memory device for reducing current consumption in a write operation for a specific input mode.

DESCRIPTION OF RELATED ART

Recently, in a tendency that a demand requesting high integration and speed of a semiconductor memory device is increased, a double data rate synchronous dynamic random access memory (DDR SDRAM) device, which performs input and output data at rising and falling edges of a clock signal, is universally used.

The DDR way has two times input/output speed than a conventional single data rate performing read/write operation at one of rising and falling edges of a clock signal. Therefore, there is a merit that a total operation speed of a device can be improved without improvement of a memory core.

Also, an input/output path having a multi-bit structure is designed in order to increase a data transmitting speed. In the input/output path having the multi-bit structure, the number of data bits to be successively inputted/outputted in response an input/output signal at one time may become 2 bits, 4 bits, 8 bits, 16 bits, 32 bits and the like. Symbols, x4, x8 and x16 represents the number of data bits to be processed at one time, i.e., 4-bit, 8-bit and 16-bit data input/output path modes in the memory device, respectively. The semiconductor memory device is designed and manufactured to be operated for all modes of x4, x8 and x16, and then a specific mode is optionally operated in response to a selection signal.

FIG. 1 is a block diagram illustrating a data input device capable of being operated at the x4, x8 and x16 modes in response of a selection signal x4/x8/x16 in a conventional DDR SDRAM.

As shown, 16 numbers of data input paths exist to implement the x16 mode. When the x16 mode is operated in response to the selection signal x4/x8/x16, the 16 input paths are operated to receive 16-bit data DATA<0:15> from an external circuit to an input buffer 10. Input data IN<0:15> outputted from the 16 data input buffers are separated into upper data and lower data, and then the upper and lower data are latched to 16 latches 20 in response to data strobe signals UDQS and LDQS inputted to a UDQS input buffer 3 and a LDQS input buffer 4. 16-bit data ALGN_PD/FD<0:15> outputted from the latches 20 are transmitted to a MUX (not shown).

In this DDR SDRAM, the data are read and written through the data paths <2, 6, 9, 13> in the x4 mode, and the data paths <1, 3, 5, 7, 9, 11, 13, 15> in the x8 mode. Other input buffers, which are not operated, should be turned off to reduce current consumption. Since the LDQS input buffer corresponding to the lower data is not used in the x4 and x8 modes, the LDQS input buffer 4 is turned off and the UDQS input buffer 3 is turned on, so that the data input is controlled only by the data strobe signal UDSQ for the upper data.

The input data IN<0:15> of 16 data paths from the data input buffers 10 are lathed each in the 16 latches 20, and then, outputted in response to the data strobe signals UDQS and LDQS, which are outputted at a rising edge and a falling edge of a clock signal, as the ALGN_RD/FD<0:15> data. The ALGN_RD/FD<0:15> data are transmitted to the MUX.

In the above DDR SDRAM, there is a problem that unnecessary current consumption is caused because all latches <0:15> are operated even for the x4 and x8 modes. Specially, when a dynamic latch is employed, the current consumption is more increased.

SUMMARY OF THE INVENTION

It is, therefore, an object of the present invention to provide a data input device in a semiconductor memory device for reducing current consumption in a write operation for a specific input mode, such an x4 or x8 mode.

In accordance with an aspect of the present invention, there is provided a data input device in a semiconductor device, including: a data strobe signal input buffer, which driven in response to a selection signal of a data input/output mode, for receiving a data strobe signal; a data input buffer driven in response to the selection signal; a repeater, which receives the selection signal and the data strobe signal input, outputs a first control signal of a first logic level when the selection signal is activated, and a second control signal of a second logic level when the selection signal is inactivated; and a latch for latching data provided from the data input buffer in response to the first control signal outputted from the repeater, wherein the latch is disabled when the second control signal is provided from the repeater.

In accordance with another aspect of the present invention, there is provided a double data rate synchronous dynamic random access memory (DDR SDRAM) for supporting a plurality of input modes, the DDR SDRAM including: a data strobe signal input buffer; a plurality of data input buffers, wherein only data input buffers selected by a selection signal are enabled; a plurality of repeaters transmitting an output signal of the data strobe signal input buffer under control of the selection signal; and a plurality of latches for storing data outputted from the data input buffers in response to output signals of the repeaters, wherein the repeaters, which is not selected by the selection signal, output a signal disabling the latches.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a data input device capable of reducing current consumption in a double data rate synchronous dynamic random access memory (DDR SDRAM) according to the present invention will be described in detail referring to the accompanying drawings.

Figure 2:
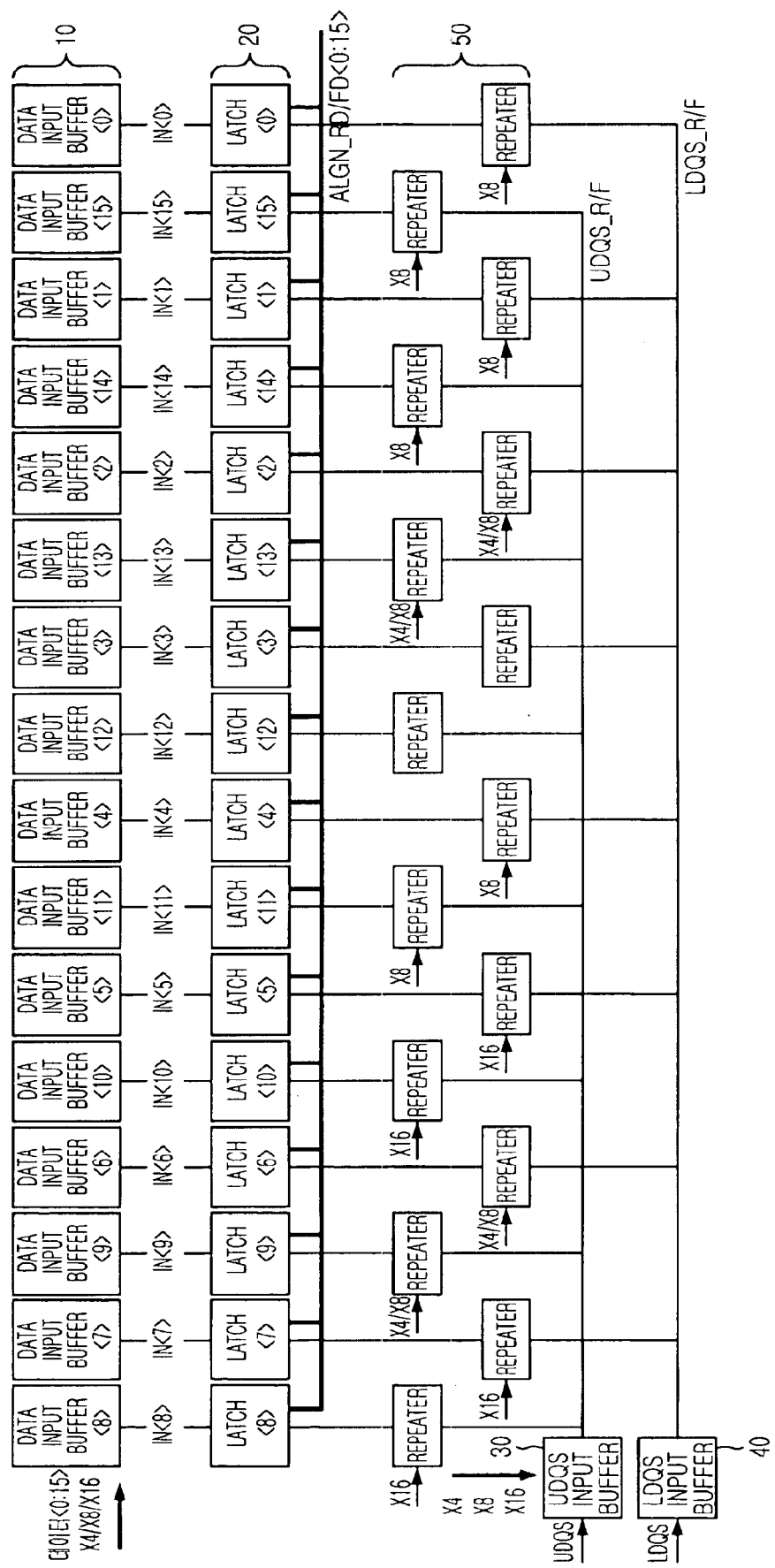
FIG. 2 is a block diagram illustrating a data input device operable at data input modes of x4, x8 and x16 in accordance with the preferred embodiment of the present invention.

FIG. 2 is a block diagram illustrating a data input device operable at data input modes of ×4, ×8 and ×16 in accordance with the preferred embodiment of the present invention.

Figure 1:
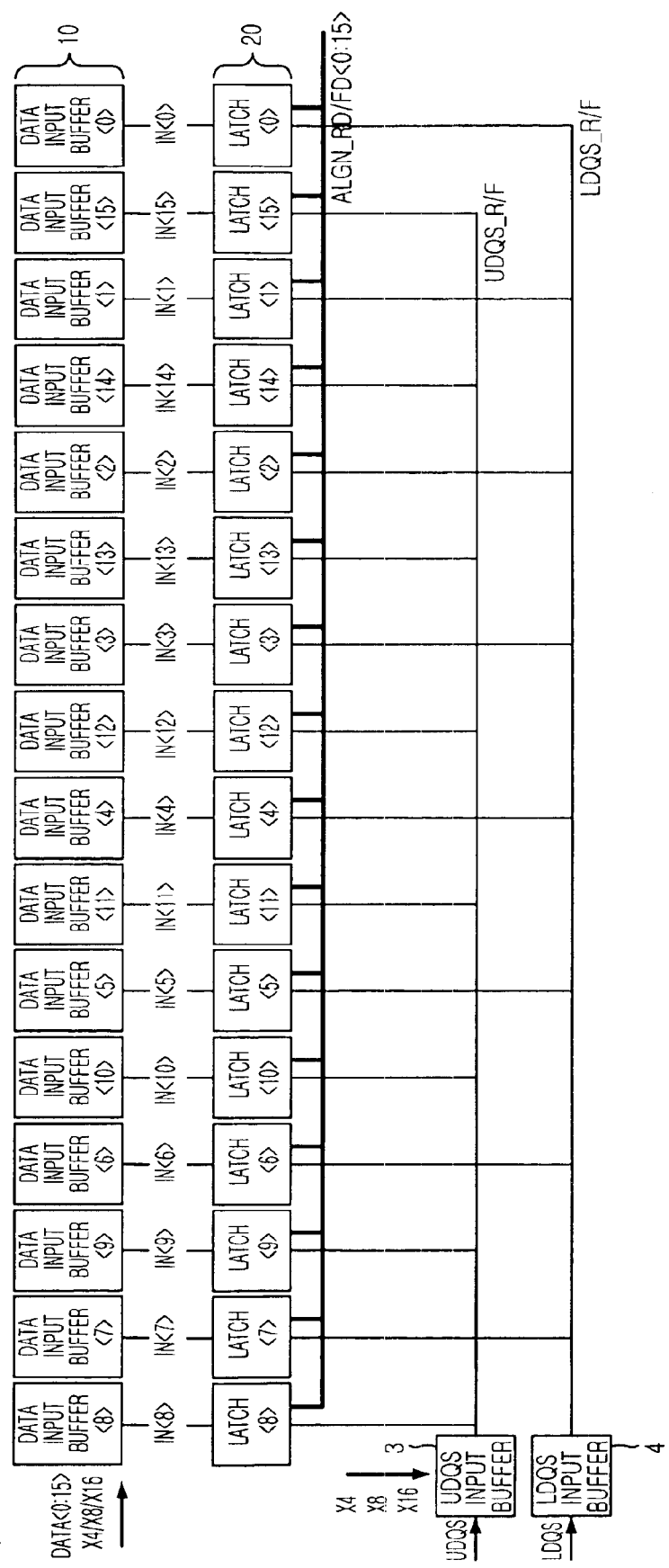
FIG. 1 is a block diagram illustrating a data input device capable of being operated at the x4, x8 and x16 modes in response of a selection signal x4/x8/x16 in a conventional DDR SDRAM.

Comparing the data input device of the present invention with the conventional data input device in FIG. 1, a plurality of repeaters 50, which are controlled by a selection signal ×4/×8/×16 are additionally disposed between the latches and the data strobe signal input buffer 30 and 40. Accordingly, all data input paths are operated in the ×16 mode, but in the ×4 and ×8 modes, only corresponding data input paths are operated, so that current consumption can be reduced.

Hereinafter, an operation of the data input device will be described in detain in accordance with the present invention.

The data input buffer includes data strobe signal input buffers 30 and 40, a plurality of data input buffers 10, a plurality of repeaters 50 and a plurality of latches 20. The data input buffers selectively enabled in response to the selection signal ×4/×8/×16 in the plurality of data input buffers 10. The repeaters 50 transmit output signals of the data strobe input buffer, which are selected by the selection signals ×4/×8/×16, to the latches and disable the other latches, which the output signals of the data strobe input buffer are not transmitted. The plurality of the latches 20 latch and output the output signals of each data input buffer 10 in response to the output signal of the repeaters 50.

The data paths <2, 6, 9, 13> are used in the ×4 mode and the data paths <1, 3, 5, 7, 9, 11, 13, 15> are used to carry out data read and write operations. For example, in the ×4 mode, the data input buffers <2, 6, 9, 13> are enabled for input data IN<2, 6, 9, 13>, and other input buffers are disabled. The input data IN<2, 6, 9, 13> outputted from the data input buffers 10 are stored in the latches 50 at rising and falling edges of the clock signal in response to the output signals of the repeaters 50, wherein the repeaters 50 receives the output signal UDQS_R/F of the strobe signal input buffer 30. At this time, the repeaters 50 are controlled by the selection signal ×4/×8/×16 and unnecessary current consumption generated from non-selected latches can be reduced.

The output signals ALGN_RD/FD<0:15> of the latches are toggled in FIG. 1 according to the prior art, however, only output signals ALGN_RD/FD<2, 6, 9, 13> are toggled in FIG. 2 in accordance with the present invention. The output signals ALGN_RD/FD<2, 6, 9, 13> are provided on global lines by column addresses in the next stages, i.e., multiplexer and write driver (not shown).

Figure 3A:
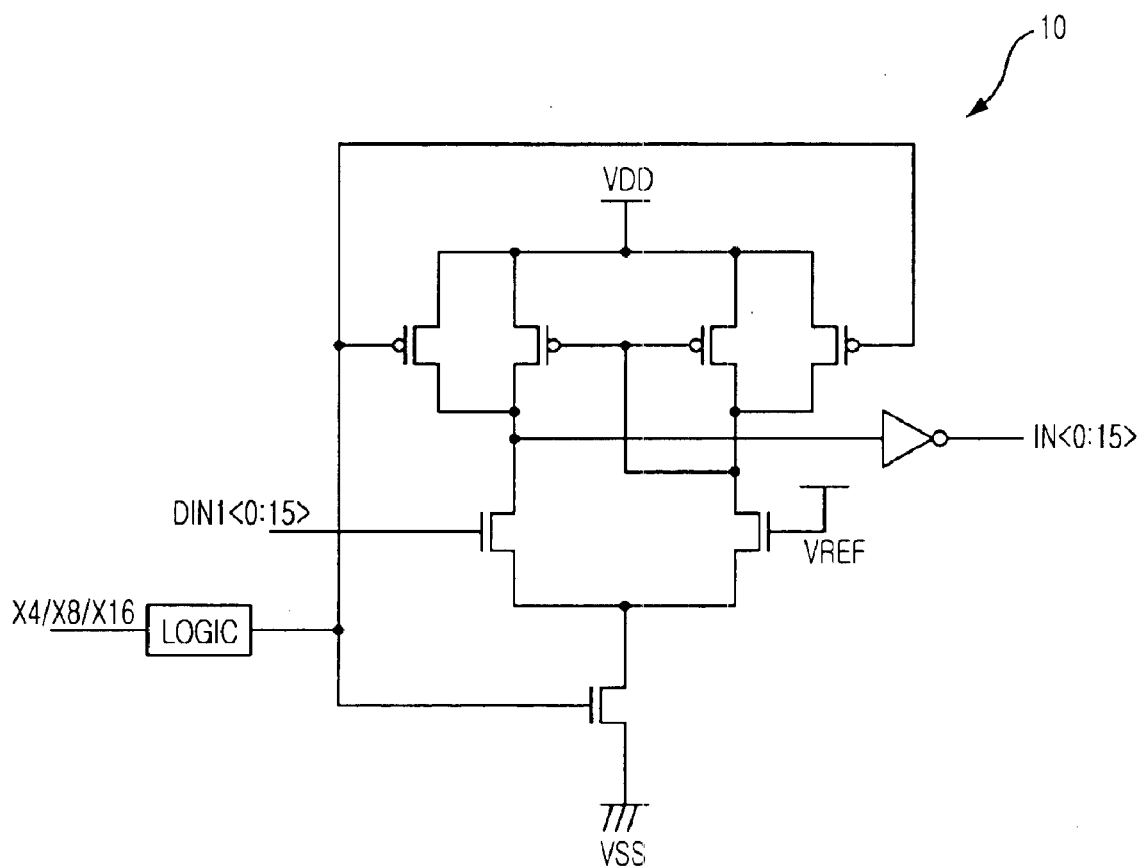
FIGS. 3A and 3B are circuit diagrams illustrating the data input buffer and the data strobe signal input buffer, respectively.
Figure 3B:
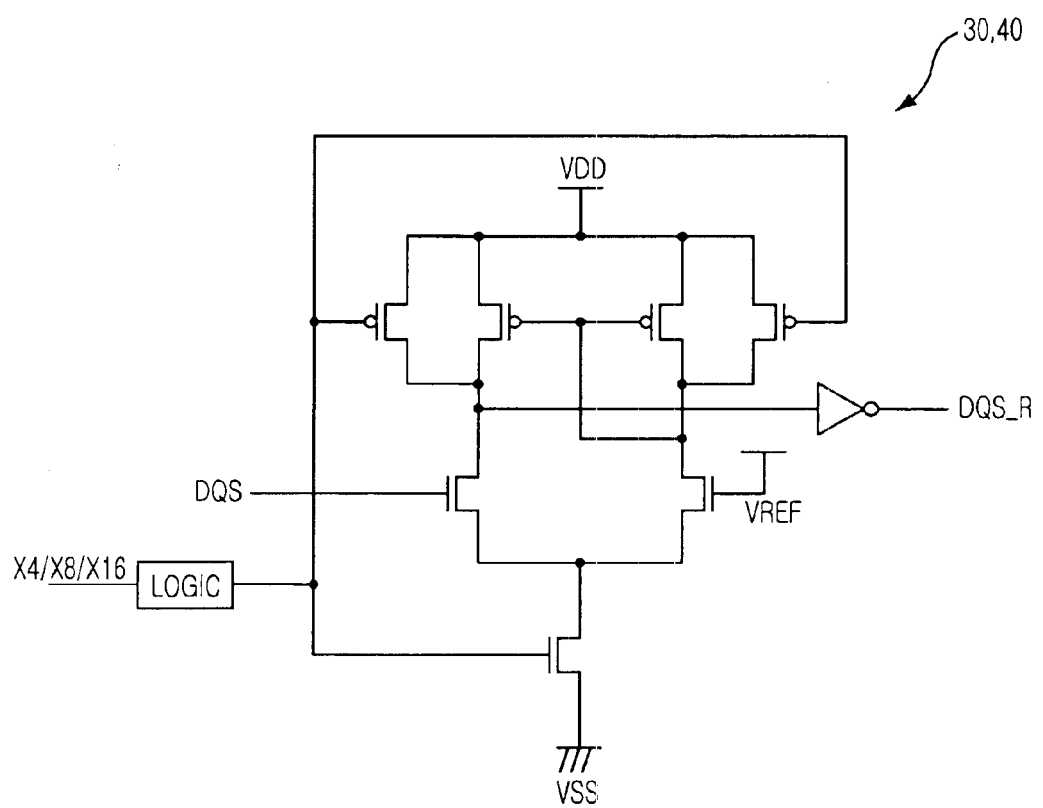

FIGS. 3A and 3B are circuit diagrams illustrating the data input buffer 10 and the data strobe signal input buffer 30 or 40, respectively.

As shown in FIG. 3A, the data input buffer 10 is configured with a differential amplifier outputting the input data IN<0:15> by comparing the data<0:15> with a reference voltage, and controlled to be enabled or disabled according to the selection signal ×4/×8/×16. An internal voltage or a external voltage may be used as a driving voltage.

Referring to FIG. 3B, the data strobe signal input buffer 30 or 40 basically has the same configuration with the input buffer 10. Input and output signals are different each other and, also, the data strobe signal input buffer is controlled by the selection signal ×4/×8/×16. Eventually, operations of the data input buffer 10 and the data strobe signal input buffer 30 or 40 are selectively carried out by the selection signal ×4/×8/×16. Namely, in the ×4 mode, the data write operation is carried out through the data paths <2, 6, 9, 13>, and, in the ×8 mode, the data write operation is performed through the data paths <1, 3, 5, 7, 9, 11, 13, 15>. Other data paths are disabled.

For example, in the ×4 mode, the data <2, 6, 9, 13> are inputted through the data input buffers <2, 6, 9, 13> and other data input buffers are disabled. The input data IN<2, 6, 9, 13> outputted from the data input buffers 10 are stored in the latches 20 by being strobed with the output signal UDQS_R/F of the upper data strobe signal input buffer 30 passing the repeater 50. In ×4 and ×8 modes, the lower data strobe signal input buffer 40 is not operated. The signals UDQS_R/F and ALGN_R/F are used to indicate all operations at the rising edge and falling of the clock signal. However, actually, when the signal UDQS_R is inputted, the signal ALGN_R is only outputted. Also, if the signal UDQS_F is inputted, the ALGN_F is only outputted.

Figure 4:
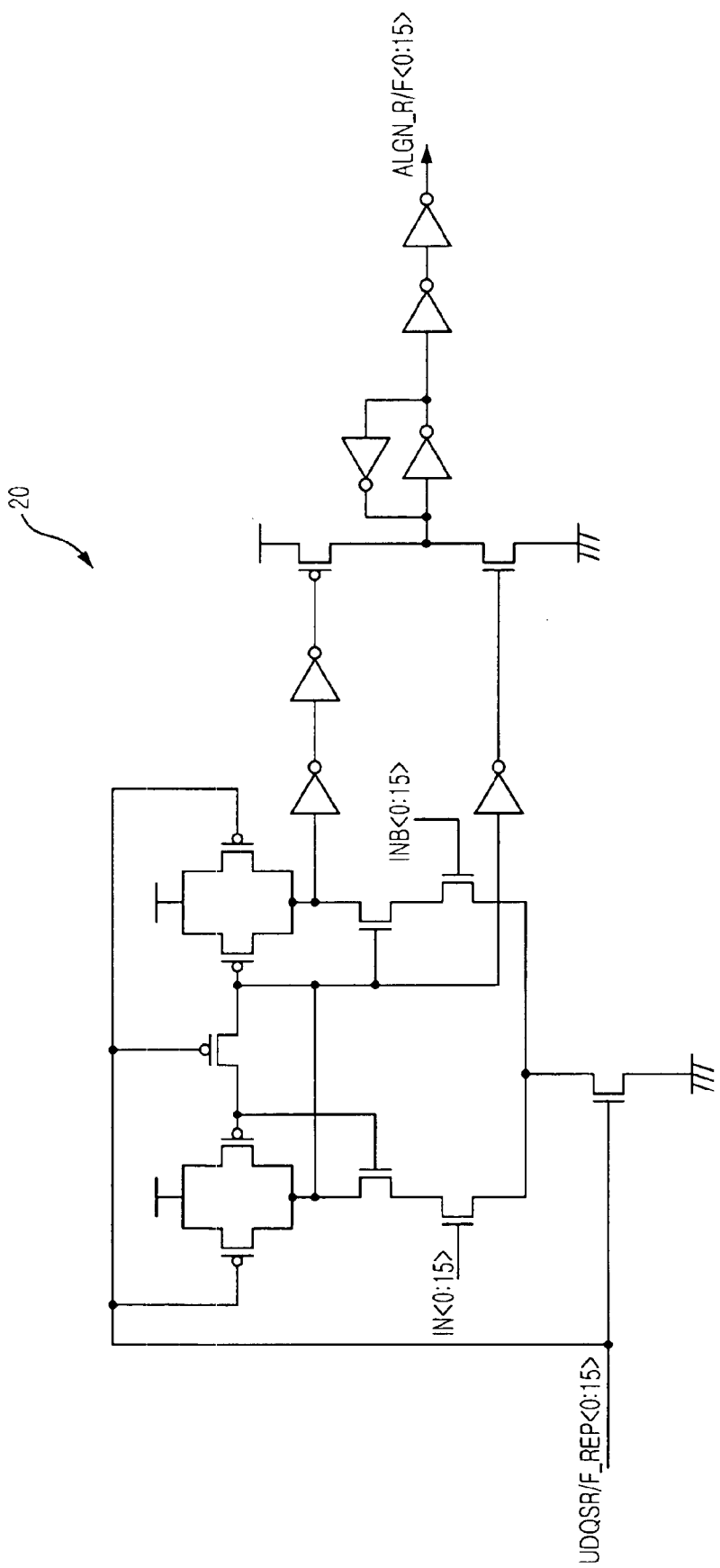
FIG. 4 is a circuit diagram illustrating the latch in FIG. in accordance with the present invention.

FIG. 4 is a circuit diagram illustrating the latch 20 in FIG. 2 in accordance with the present invention.

The latch 20 includes a differential amplifier and a plurality of inverters. The latch 20 is enabled or disabled in response to an output signal UDQSR/F_REP<0:15> of the repeater 50. The latch 20 illustrated in FIG. 4 is a dynamic latch, and a static latch can be also employed. When the output signal UDQSR/F_REP<0:15> of the repeater 50 of logic high 'H' is inputted, that is, before a setup time, if data of a logic high 'H' is inputted, the data is maintained during a hold time and then the output signal ALGN_R/F<0:15> of a logic high 'H' is outputted. Thereafter, even if the UDQSR/F_REP<0:15> becomes logic low 'L', a logic value of the output signal is maintained by being latched. The outputted signal ALGN_R/F<0:15> are written in a memory cell (not shown) through the multiplexer and the write driver.

Since the latch 20 is operated in response to the output signal UDQSR/R_REP<0:15> of the repeater 50 and the repeater 50 is controlled by the selection signal ×4/×8/×16, undesired operation of the latch 20 can be prevented.

Figure 5:
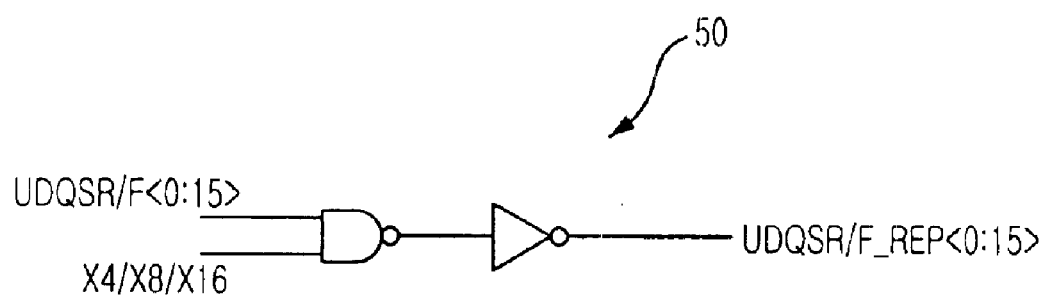
FIG. 5 is a circuit diagram illustrating the repeater in accordance with the present invention.

FIG. 5 is a circuit diagram illustrating the repeater 50 in accordance with the present invention.

As shown, the repeater 50 consists of a NAND gate and an inverter. The NAND gate receives the output signals UDQS_R/F of the data strobe signal input buffers 30 and 40 and the selection signal ×4/×8/×16. An output of the NAND gate is applied to the inverter and the inverter outputs the signals UDQSR/F_REP<0:16> to the latch 20.

The repeater 50 transmits the data strobe signals to the latches corresponding to the data paths selected by the current input/output mode. The repeater 50 transmits the signal of a logic low level to the non-selected latches to be disabled to thereby reduce the undesirable current consumption. Also, as a logic high 'H' transition time is quicker than a logic low 'L' transition time by adjusting a size of NMOS and PMOS transistors, the repeater 50 can reduce skew, so that a data setup time and a hold time for each input/output path, i.e., tDS and tDH can be effectively controlled.

While the present invention has been described with respect to the particular embodiments, it will be apparent to those skilled in the art that various changes and modifications may be made without departing from the spirit and scope of the invention as defined in the following claims.

What is claimed is:

1. A data input device in a semiconductor device, comprising:

a data strobe signal input buffer, which is driven in response to a selection signal of a data input/output mode, for receiving a data strobe signal;

a data input buffer driven in response to the selection signal;

a repeater, which receives the selection signal and the data strobe signal input, outputs a first control signal of a first logic level when the selection signal is activated, and a second control signal of a second logic level when the selection signal is inactivated; and a latch for latching data provided from the data input buffer in response to the first control signal outputted from the repeater, wherein the latch is disabled when the second control signal is provided from the repeater.

2. The input device as recited in claim 1, wherein the repeater includes:

a NAND gate receiving the data strobe signal provided from the data strobe signal input buffer and the selection signal; and an inverter receiving an output of the NAND gate.

3. The input device as recited in claim 2, wherein a logic high 'H' transition time of the output signal of the repeater is quicker than a logic low 'L' transition time.

4. The input device as recited in claim 1, wherein the latch is a dynamic latch or a static latch.

5. A double data rate synchronous dynamic random access memory (DDR SDRAM) for supporting a plurality of input modes, the DDR SDRAM comprising:

a data strobe signal input buffer;

a plurality of data input buffers, wherein only data input buffers selected by a selection signal are enabled;

a plurality of repeaters transmitting an output signal of the data strobe signal input buffer under control of the selection signal; and a plurality of latches for storing data outputted from the data input buffers in response to output signals of the repeaters, wherein the repeaters, which is not selected by the selection signal, output a signal disabling the latches.

6. The DDR SDRAM as recited in claim 5, wherein each repeater includes:

a NAND gate receiving the data strobe signal provided from the data strobe signal input buffer and the selection signal; and an inverter receiving an output of the NAND gate.

7. The DDR SDRAM as recited in claim 6, wherein a logic high 'H' transition time of the output signal of the repeater is quicker than a logic low 'L' transition time.

8. The DDR SDRAM as recited in claim 5, wherein the selection signal is one of mode selection signls, ×4 mode, ×8 mode and ×16 mode.

9. The DDR SDRAM as recited in claim 8, wherein the data strobe signal input buffer includes a upper input buffer and a lower input buffer, wherein the low input buffer is disabled and the upper buffer is enabled in the ×4 and ×8 modes.

* * * * *